(12) United States Patent
Glodde (10) Patent No.: US 10,170,301 B2
(45) Date of Patent: Jan. 1, 2019

(54) ADHESION OF POLYMERS ON SILICON SUBSTRATES

(71) Applicant: International Business Machines Corporation, Armonk, NY (US)

(72) Inventor: Martin Glodde, Pine Brook, NJ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/472,370

(22) Filed: Mar. 29, 2017

(65) Prior Publication Data

US 2018/0286670 A1 Oct. 4, 2018

(51) Int. Cl.
| H01L 21/02 | (2006.01) |
| H01L 23/29 | (2006.01) |
| H01L 23/31 | (2006.01) |
| H01L 21/027 | (2006.01) |

(52) U.S. Cl.
CPC .. *H01L 21/02301* (2013.01); *H01L 21/02118* (2013.01); *H01L 21/02282* (2013.01); *H01L 23/293* (2013.01); *H01L 23/3171* (2013.01); *H01L 21/0273* (2013.01)

(58) Field of Classification Search
CPC ......... H01L 21/02112; H01L 21/02118; H01L 21/02282; H01L 23/293; H01L 23/3171; H01L 21/0273
See application file for complete search history.

(56) References Cited

U.S. PATENT DOCUMENTS

| 7,423,234 | B2 | 9/2008 | Dumont et al. |
| 7,553,776 | B2 | 6/2009 | Buriak et al. |
| 7,816,280 | B2 | 10/2010 | Usami |
| 8,685,529 | B1 | 4/2014 | Cho et al. |
| 8,785,585 | B2 | 7/2014 | Furuya et al. |
| 9,263,289 | B2 | 2/2016 | Hattori et al. |
| 2008/0090380 | A1 | 4/2008 | Gardner et al. |
| 2009/0280337 | A1* | 11/2009 | Semetey ............ C08J 7/047 428/447 |
| 2010/0210794 | A1 | 8/2010 | Frese et al. |
| 2015/0079793 | A1 | 3/2015 | Hattori et al. |
| 2016/0079370 | A1* | 3/2016 | Sugiyama ......... H01L 21/02389 257/76 |
| 2016/0218032 | A1* | 7/2016 | Millward ............ B81C 1/00031 |

OTHER PUBLICATIONS

Khung et al. "Thermal and UV Hydrosilylation of Alcohol-Based Bifunctional Alkynes on Si (111) surfaces: How surface radicals influence surface bond formation", Nature Scientific Reports 5:11299, Jun. 12, 2015, pp. 1-13.
U.S. Appl. No. 15/429,871, filed Feb. 10, 2017, entitled "Method to Increase the Lithographic Process Window of Extreme Ultra Violet Negative Tone Development Resists."

* cited by examiner

*Primary Examiner* — Fei Fei Yeung Lopez
(74) *Attorney, Agent, or Firm* — Cantor Colburn LLP; Vazken Alexanian (57) ABSTRACT

Embodiments are directed to a method and resulting structures for improving the adhesion of a polymer to the surface of a substrate. A substrate is formed and a surface of the substrate is modified to include X—H functional group terminations. A polymer is formed on the modified surface of the substrate. The polymer and substrate are heated to chemically bond the polymer to the surface of the substrate.

16 Claims, 5 Drawing Sheets

ADHESION OF POLYMERS ON SILICON SUBSTRATES

BACKGROUND

The present invention relates in general to semiconductor device fabrication methods and resulting structures. More specifically, the present invention relates to methods and resulting structures for improving the adhesion of organic underlayers to the surface of a substrate.

In contemporary semiconductor device fabrication processes a large number of discrete microelectronic devices, such as field effect transistors (FETs), are fabricated on a single wafer. FETs are well known in the electronic arts and form the basis of modern integrated circuit (IC) design, logic, and memory applications. IC fabrication commonly involves sequential deposition and etching steps to pattern the materials that form these discrete devices. Radiation sensitive materials (photoresists) are commonly used to transfer device patterns into functional materials. Processing steps include pattern-defined radiation exposure, pattern development, and then transfer into the functional material via differential etching. Continued improvement in IC performance is dictated by reductions in device size and progress is gated by advances in photolithographic techniques and process resolution.

SUMMARY

According to one or more embodiments of the present invention, a method for adhering a polymer to a surface of a substrate is provided. The method includes forming a substrate and modifying a surface of the substrate to include X—H terminations. The method further includes forming a polymer on the modified surface of the substrate. The polymer and substrate are heated to chemically bond the polymer to the surface of the substrate.

According to one or more embodiments of the present invention, a method for improving the adhesion of organic underlayers to the surface of a silicon wafer is provided. The method includes modifying a surface of a silicon wafer to include hydrosilane terminations. A self-crosslinkable organic planarization layer (OPL) including hydroxyl, alkene, or alkyne functional group terminations is spin-coated onto the modified surface of the silicon wafer. The silicon wafer and the self-crosslinkable OPL are heated to a temperature operable to chemically bond the self-crosslinkable OPL to the surface of the silicon wafer.

According to one or more embodiments of the present invention, a semiconductor device is provided. The structure includes a silicon substrate having a modified surface. The surface is modified to include hydrosilane terminations. The structure further includes a polymer formed on the modified surface of the substrate. The polymer is chemically bonded to the modified surface of the substrate.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. The term "selective to," such as, for example, "a first element selective to a second element," means that a first element can be etched and the second element can act as an etch stop. The term "conformal" (e.g., a conformal layer) means that the thickness of the layer is substantially the same on all surfaces, or that the thickness variation is less than 15% of the nominal thickness of the layer.

As used herein, the terms "about," "substantially," "approximately," and variations thereof are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), plasma-enhanced chemical vapor deposition (PECVD), electrochemical deposition (ECD), molecular beam epitaxy (MBE), and more recently, atomic layer deposition (ALD) and plasma-enhanced atomic layer deposition (PEALD), among others.

Removal/etching is any process that removes material from the wafer. Examples include etch processes (either wet or dry), and chemical-mechanical planarization (CMP), and the like. A reactive ion etch (RIE), for example, is a type of dry etch that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a description of technologies that are more specifically relevant to the present invention, as previously noted herein, device fabricators rely on an increasingly sophisticated lithography techniques to form microelectronic device structures having progressively smaller critical dimensions. There are challenges, however, in providing process resolutions sufficient for scaling these devices beyond the 10 nm node. Conventional single exposure single layer photoresists, for example, are not capable of providing 10 nm feature sizes. As semiconductor device critical dimensions continuously scale downward, device fabricators have turned to the development of improved resolution multilayer photoresists. These multilayer photoresists typically include organic planarizing layers (OPLs) because high resolution photoresists themselves often do not provide enough etch resistance for pattern transfer. OPLs are used as etch masks for pattern transfers into inorganic substrates, to fill pre-existing features, and to planarize the substrate to allow for larger patterning process windows.

The development of improved resolution photoresists with organic material underlayers, however, is highly constrained by the available intrinsic chemical and optical properties of these materials. In some cases, for example, it is desired or necessary to remove (via, e.g., wet stripping) residuals of other etch mask materials remaining on top of an OPL. In other cases it is desirable to use a wet etch to recess substrate materials in the areas exposed by an OPL RIE. Current OPL materials often delaminate from the substrate during these treatments. Delamination not only limits the available wets processes but can also lead to process disruptions due to tool contamination. Conventional approaches to improve adhesion and reduce delamination of spin-on materials formed on a wafer surface rely on the treatment of the substrate surface with hexamethyldisilazane (HMDS, also known as bis(trimethylsilyl)amine). Treatment of silicon substrates with HMDS is limited however, because HMDS priming on a silicon surface can only result in a methyl surface layer. Consequently, the spin-on layer is only bound to the silicon substrate surface through weak van der Waals forces.

Turning now to an overview of the aspects of the present invention, one or more embodiments provide methods for greatly enhancing the wets stability of polymers (including, e.g., OPLs) on silicon, silicon germanium (SiGe), or germanium (Ge) substrates. The surface of the substrate is prepared by treating the surface with dilute hydrofluoric acid (dHF) prior to the polymer coating step. The dHF treatment results in an X—H bond formation. For example, silicon substrates treated with dHF yield a hydrosilane (Si—H) terminated substrate surface while germanium substrates yield a Ge—H terminated substrate surface. The X—H bonds (e.g., hydrosilanes) are not particularly stable, and consequently, the treated surface reacts with hydroxyl (—OH), alkene (—$C_nH_{2n}$), or alkyne (—$C_nH_{2n-2}$) groups. A self-crosslinkable polymer formulation having pendant hydroxyl, alkene, or alkyne functional groups is spin-coated onto the treated surface of the substrate (as used herein, "self-crosslinkable" refers to a polymer that has crosslinking sites). The substrate is then heated to a temperature operable to crosslink the hydroxyl, alkene, or alkyne groups and to chemically bond some of these groups to the treated surface of the substrate. In this manner, the X—H terminations serve as chemical adhesion promoters. Consequently, the polymer is chemically bonded to the surface of the substrate. An OPL formed in this manner is much more resistant to delamination during downstream wets processing relative to OPLs bonded to a silicon substrate via only weak van der Waals bonds.

Example methods for improving the adhesion of polymers to the surface of a substrate and the resulting structures therefrom in accordance with embodiments of the present invention are described in detail below by referring to the accompanying drawings in FIGS. 1-5.

Figure 1:
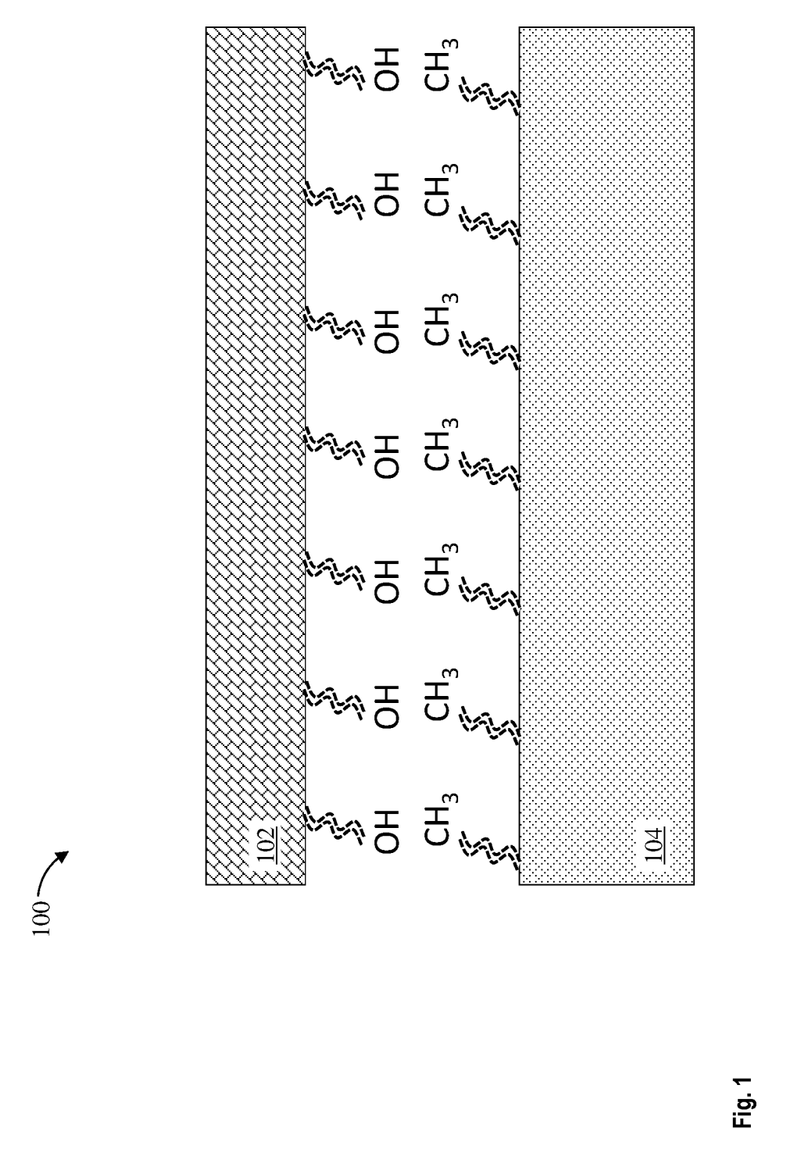
FIG. 1 depicts a cross-sectional view of a structure having an OPL formed on a surface of a silicon substrate during an intermediate operation of a method of fabricating a semiconductor device according to conventional processes.

FIG. 1 illustrates a cross-sectional view of a structure 100 having an OPL 102 formed on a surface of a silicon substrate 104 after treating the surface of the silicon substrate 104 with HMDS during an intermediate operation of a method of fabricating a semiconductor device according to conventional processes. As discussed previously herein, the HMDS treatment results in a highly methylized silicon substrate surface. For ease of discussion the OPL 102 is depicted as having hydroxyl terminated functional groups. It is understood, however, that the OPL 102 can be formed from any known organic underlayer suitable for photolithography and that the OPL 102 can have various terminating functional groups. Irrespective of the specific OPL materials and the corresponding terminating functional groups, the functional groups of the OPL 102 are bound to the surface of the substrate 104 through weak van der Waals forces due to the relative stability of the terminating methyl groups of the substrate 104. Consequently, the OPL 102 suffers from poor wets stability and partial or total delamination during subsequent downstream processing.

Figure 2:
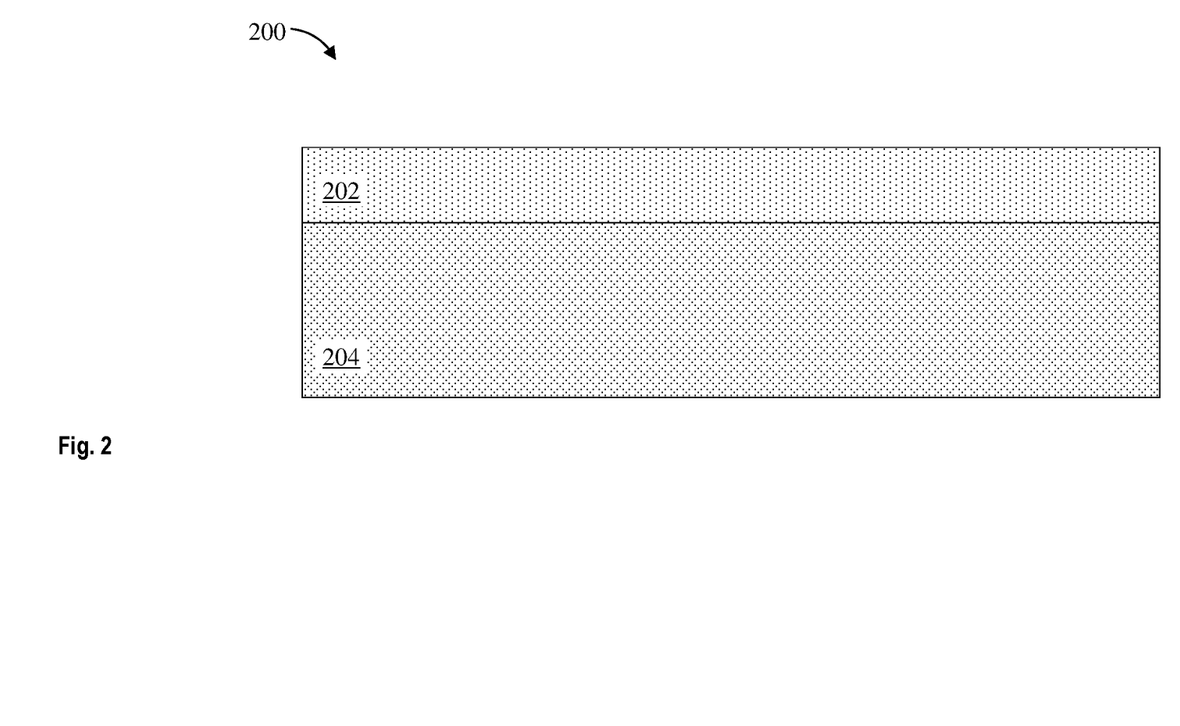
FIG. 2 depicts a cross-sectional view of a structure having an oxide layer formed on a surface of a substrate during an intermediate operation of a method of fabricating a semiconductor device according to one or more embodiments of the present invention.

FIG. 2 illustrates a cross-sectional view of a structure 200 having an oxide layer 202 formed on a surface of a substrate 204 during an intermediate operation of a method of fabricating a semiconductor device according to one or more embodiments. The oxide layer 202 can be a native oxide or other contaminate formed on the surface of the substrate 204 during the semiconductor device fabrication process. Silicon surfaces and epitaxial layers are susceptible to oxide formation and contamination when exposed to typical ambient conditions. For example, a native oxide layer can form on a monocrystalline silicon wafer surface prior to deposition of the epitaxial layer. Moreover, contaminants present in the ambient environment readily deposit on the surface of a silicon wafer. The presence of these native oxide layers or contaminants on a substrate negatively affects the quality of layers subsequently formed on the substrate surface (e.g., OPL or epitaxial layers).

The substrate 204 can be made of any suitable substrate material having resistance to dHF etching, such as, for example, monocrystalline Si, amorphous Si, Ge, or SiGe. In some embodiments, the substrate 104 includes a buried oxide layer (not depicted). In some embodiments, the substrate 104 includes both an nFET region and a pFET region. In some embodiments, the substrate 104 includes either an nFET region or a pFET region.

Figure 3:
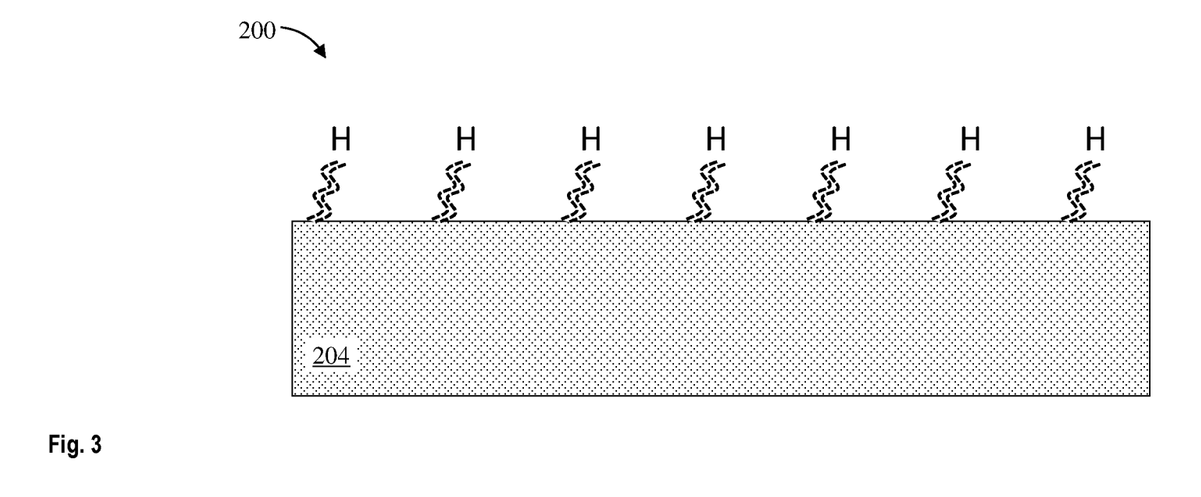
FIG. 3 depicts a cross-sectional view of the structure after removing the oxide layer during an intermediate operation of a method of fabricating a semiconductor device according to one or more embodiments of the present invention.

FIG. 3 illustrates a cross-sectional view of the structure 200 after removing the oxide layer 202 during an intermediate operation of a method of fabricating a semiconductor device according to one or more embodiments. The oxide layer 202 is removed using a dHF treatment. In some embodiments, the dHF treatment includes exposing the surface of the substrate 204 to a mixture of deionized water and hydrofluoric acid at a dilution concentration of about 100 parts water to about one part hydrogen fluoride. While removing the oxide layer 202, the dHF treatment also acts to modify the surface of the substrate 204 to include X—H terminations. In embodiments having a silicon substrate, the dHF treatment yields hydrosilane (Si—H) terminations. In embodiments having a germanium substrate, the dHF treatment yields Ge—H terminations. In embodiments having a SiGe substrate, the dHF treatment yields Si—H or Ge—H terminations.

In contrast to the methyl terminations formed on the surface of a substrate following HMDS treatment (see FIG. 1), the X—H terminations formed following dHF treatment are not stable and readily form bonds when exposed to hydroxyl, alkene, or alkyne groups. In some embodiments, the dHF treatment is replaced with an ammonium fluoride ($NH_4F$) treatment. The $NH_4F$ treatment similarly acts to modify the surface of the substrate 204 to include X—H terminations. In some embodiments, the $NH_4F$ treatment includes exposing the surface of the substrate 204 to a mixture of deionized water and $NH_4F$ at a dilution concentration of about 100 parts water to about one part $NH_4F$.

Figure 4:
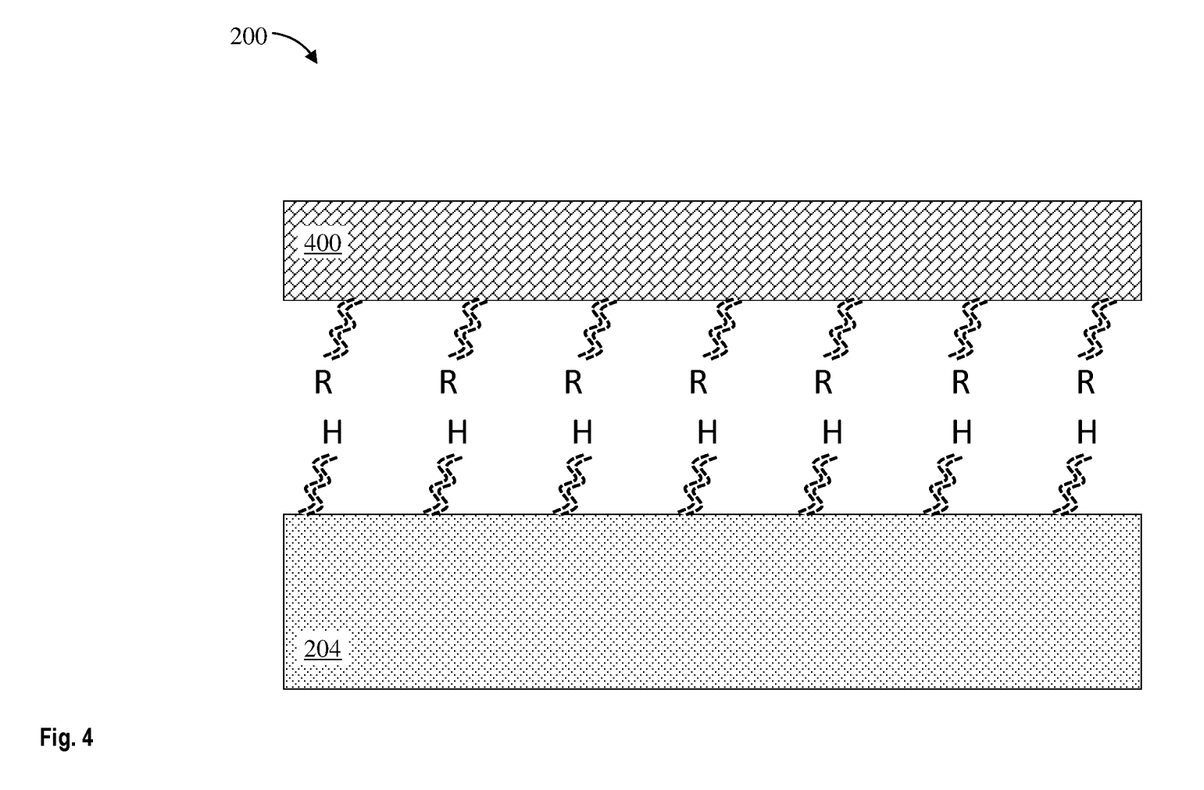
FIG. 4 depicts a cross-sectional view of the structure after forming a self-crosslinkable polymer OPL on a surface of the substrate during an intermediate operation of a method of fabricating a semiconductor device according to one or more embodiments of the present invention.

FIG. 4 illustrates a cross-sectional view of the structure 200 after forming a self-crosslinkable polymer OPL 400 on a surface of the substrate 204 during an intermediate operation of a method of fabricating a semiconductor device according to one or more embodiments. Any known manner for forming an OPL on the surface of a substrate can be used, such as, for example, spin-coating. The formulation of the self-crosslinkable polymer OPL 400 is selected to ensure that the self-crosslinkable polymer OPL 400 contains pendant hydroxyl, alkene, or alkyne groups (as depicted in FIG. 4, hydroxyl, alkene, and alkyne groups are collectively referred to herein as functional groups R).

Figure 5:
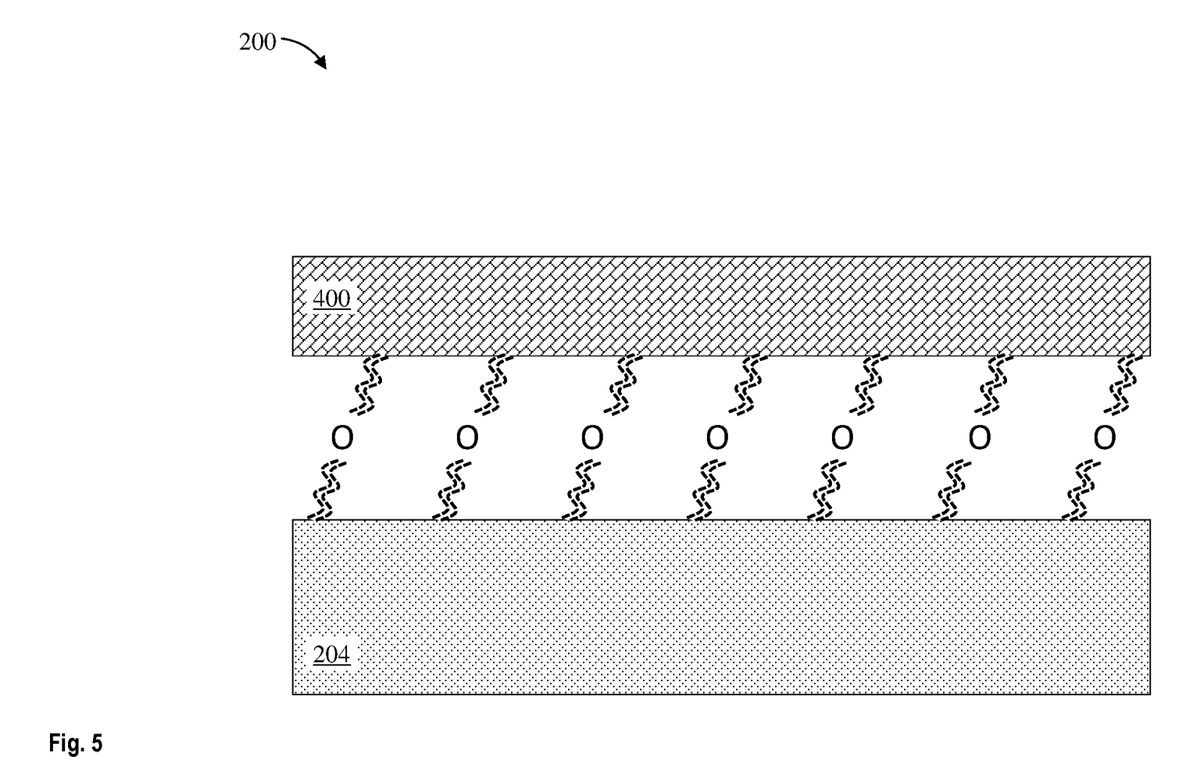
FIG. 5 depicts a cross-sectional view of the structure after heating the substrate and the self-crosslinkable polymer OPL to a temperature operable to crosslink and chemically bond pendant functional groups of the self-crosslinkable polymer OPL to the surface of the substrate during an intermediate operation of a method of fabricating a semiconductor device according to one or more embodiments of the present invention.

FIG. 5 illustrates a cross-sectional view of the structure 200 after heating the substrate 204 and the self-crosslinkable polymer OPL 400 to a temperature operable to crosslink and chemically bond pendant functional groups of the self-crosslinkable polymer OPL 400 to the surface of the substrate 204 during an intermediate operation of a method of fabricating a semiconductor device according to one or more embodiments. The substrate 204 and the self-crosslinkable polymer OPL 400 can be heated using any known process, such as, for example, by a high temperature post apply bake (PAB) process, by exposure to a high temperature nitrogen gas, or by other like processes. Sufficiently heating the substrate 204 and the self-crosslinkable polymer OPL 400 causes some of the pendant functional groups of the self-crosslinkable polymer OPL 400 (e.g., hydroxyl, alkene, or alkyne groups) to chemically bond to the surface of the substrate 204 via the reaction of the functional groups to the hydrosilane terminations of the substrate 204. In some embodiments, the substrate 204 and the self-crosslinkable polymer OPL 400 are subjected to a two-stage high temperature PAB process at an initial temperature of about 225 degrees Celsius for a period of time of about one (1) minute followed by a temperature of about 350 degrees Celsius for a period of time of about one (1) minute.

Characterization

An organic underlayer was spin-coated onto surfaces of (I) untreated silicon; (II) HMDS-treated silicon; and (III) dHF treated silicon having hydrosilane terminations formed according to one or more embodiments of the present invention. The three surfaces were subjected to a two-stage high temperature PAB process at an initial temperature of about 225 degrees Celsius for a period of time of about one (1) minute followed by a temperature of about 350 degrees Celsius for a period of time of about one (1) minute.

Portions of the three surfaces were exposed to a one (1) minute hot SC1 mixture ($H_2O$ to $H_2O_2$ to $NH_3$ ratios of about 50:1.5:1) at a temperature of about 65 degrees Celsius. The untreated silicon and HMDS-treated silicon were completely delaminated after about one (1) minute. The dHF treated silicon having hydrosilane terminations showed the beginnings of delamination after about five (5) minutes. Other portions of the three surfaces were exposed to a 5% dHF wash at room temperature. The untreated silicon and HMDS-treated silicon were completely delaminated after about one (1) minute. The dHF treated silicon having hydrosilane terminations was stable.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A method for adhering a polymer to a surface of a substrate, the method comprising:
    forming a substrate;
    forming a modified surface of the substrate, where the modified surface comprises X—H terminations;
    forming a polymer on the modified surface of the substrate, the polymer comprising a self-crosslinkable organic planarization layer (OPL) comprising hydroxyl, alkene, or alkyne functional group functional groups; and
    chemically bonding the polymer to the modified surface of the substrate.

2. The method of claim 1, wherein the substrate comprises silicon, germanium, or silicon germanium.

3. The method of claim 1, wherein modifying the surface of the substrate comprises exposing the surface of the substrate to diluted hydrofluoric acid comprising a mixture of deionized water and hydrogen fluoride at a dilution concentration of about 100 parts water to about one part hydrogen fluoride.

4. The method of claim 1, wherein X is silicon (Si) or germanium (Ge).

5. The method of claim 1, wherein modifying the surface of the substrate comprises exposing the surface of the substrate to diluted ammonium fluoride ($NH_4F$) comprising a mixture of deionized water and $NH_4F$ at a dilution concentration of about 100 parts water to about one part $NH_4F$.

6. The method of claim 1, wherein chemically bonding the polymer to the surface of the substrate further comprises heating the substrate and the polymer to a temperature operable to chemically bond the polymer to the surface of the substrate.

7. The method of claim 6, wherein chemically bonding the polymer to the surface of the substrate further comprises chemically bonding some of the functional groups of the polymer to the X—H functional groups of the substrate.

8. The method of claim 1, wherein chemically bonding the polymer to the surface of the substrate further comprises a high temperature post apply bake (PAB) process.

9. The method of claim 8, wherein the PAB process further comprises heating the substrate and the polymer to a temperature of about 225 degrees Celsius for a period of time of about one (1) minute and then heating the substrate and the polymer to a temperature of about 350 degrees Celsius for a period of time of about one (1) minute.

10. The method of claim 1 further comprising removing a native oxide layer from a surface of the substrate.

11. A method for adhering an organic underlayer to a surface of a silicon wafer, the method comprising:
    modifying the surface of the silicon wafer to comprise hydrosilane terminations;
    spin-coating a self-crosslinkable organic planarization layer (OPL) comprising hydroxyl, alkene, or alkyne functional group terminations onto the modified surface of the silicon wafer; and
    heating the silicon wafer and the self-crosslinkable OPL to a temperature operable to chemically bond the self-crosslinkable OPL to the surface of the silicon wafer.

12. The method of claim 11, wherein modifying the surface of the silicon wafer comprises exposing the surface of the silicon wafer to diluted hydrofluoric acid comprising a dilution concentration of about 100 parts water to about one part hydrogen fluoride.

13. The method of claim 11, wherein chemically bonding the self-crosslinkable OPL to the surface of the silicon wafer further comprises chemically bonding some of the hydroxyl, alkene, or alkyne functional group terminations of the self-crosslinkable OPL to the hydrosilane terminations of the silicon wafer.

14. The method of claim 11, wherein heating the silicon wafer and the self-crosslinkable OPL further comprises heating to a temperature of about 225 degrees Celsius for about one (1) minute and then heating to a temperature of about 350 degrees Celsius for about one (1) minute.

15. A semiconductor device comprising:
   a silicon substrate comprising a modified surface comprising hydrosilane functional groups; and
   a polymer formed on the modified surface of the substrate, the polymer comprising a self-crosslinkable polymer organic planarization layer (OPL) comprising hydroxyl, alkene, or alkyne functional groups;
   wherein the polymer is chemically bonded to the modified surface of the substrate.

16. The semiconductor device of claim 15, wherein some of the hydroxyl, alkene, or alkyne functional groups of the self-crosslinkable polymer OPL are chemically bonded to some of the hydrosilane functional groups of the substrate.

* * * * *